United States Patent [19]

Ivory et al.

[11] Patent Number: 5,656,411
[45] Date of Patent: Aug. 12, 1997

[54] COATING COMPOSITIONS AND THEIR USE AS SOLDER RESISTS

[75] Inventors: Nicholas Eric Ivory, Glastonbury; Wrenford John Thatcher, Frome, both of Great Britain

[73] Assignee: Coates Brothers PLC, United Kingdom

[21] Appl. No.: 193,087

[22] PCT Filed: Aug. 25, 1992

[86] PCT No.: PCT/GB92/01561

§ 371 Date: Feb. 23, 1994

§ 102(e) Date: Feb. 23, 1994

[87] PCT Pub. No.: WO93/06530

PCT Pub. Date: Apr. 1, 1993

[30] Foreign Application Priority Data

Sep. 27, 1991 [GB] United Kingdom .............. 9120695

[51] Int. Cl.$^6$ .............................. G03C 5/00; G03F 7/00
[52] U.S. Cl. .............................. 430/270.1; 430/281.1; 430/286.1; 430/311; 430/313
[58] Field of Search ............................. 430/270, 280, 430/286, 311, 313

[56] References Cited

U.S. PATENT DOCUMENTS

| 4,067,838 | 1/1978 | Hayashi | 260/29.2 TN |
|---|---|---|---|
| 4,391,931 | 7/1983 | Haigh et al. | 523/318 |
| 4,438,189 | 3/1984 | Geissler et al. | 430/280 |
| 4,463,120 | 7/1984 | Collins et al. | 524/274 |
| 4,548,977 | 10/1985 | South, Jr. | 524/310 |

FOREIGN PATENT DOCUMENTS

| 0092516 | 1/1983 | European Pat. Off. . |
|---|---|---|
| 0103968 | 4/1984 | European Pat. Off. . |
| 0138209 | 3/1985 | European Pat. Off. . |
| 0153679 | 5/1985 | European Pat. Off. . |
| 107034 | 6/1977 | Japan . |
| 21154 | 8/1991 | Japan . |
| 1066285 | 7/1965 | United Kingdom . |

OTHER PUBLICATIONS

International Search Report.

"The Chemistry of Organic Film Formers," D.H. Solomon, Robert E. Kreiger Publishing Co. Inc., 1982, pp. 187–210.

*Primary Examiner*—Kathleen Duda
*Attorney, Agent, or Firm*—Wigman, Cohen, Leitner & Myers, P.C.

[57] ABSTRACT

A two-part system for the preparation of a thermally curable coating composition, in which one-pack contains a thermally curable material and the other contains a curing system potentially reactive therewith, at least one of the packs having water as the principal liquid carrier.

6 Claims, No Drawings

COATING COMPOSITIONS AND THEIR USE AS SOLDER RESISTS

This invention is concerned with improvements in and relating to coating compositions. More particularly, the invention relates to so-called "resist" compositions, particularly solder resist compositions, for use in the manufacture of printed circuit boards.

Resist compositions are used, in the manufacture of printed circuit boards, to form patterned layers on the surfaces of appropriate substrates (e.g. copper-clad phenolic laminate boards) so that some areas are protected and others not protected against subsequent treatment of some sort, such as, for example, etching, plating or contact with molten solder. Resists intended for protection of parts of a substrate against solder are commonly formed solder resists.

A patterned layer of a resist may be applied to a substrate by applying a liquid in patterned form (commonly through an appropriately patterned or masked screen) and then curing the applied layer to form the final resist, for example by exposure to radiation in the case of radiation-sensitive compositions or by thermal curing in the case of thermally curable compositions. Alternatively, using a photoimaging technique, a layer of radiation sensitive (generally UV-sensitive) liquid coating is applied over the surface of the substrate and then, commonly after drying to form a tack-free film, imagewise exposed to appropriate radiation through an appropriately patterned mask. Depending on the nature of the photosensitive material in the resist composition, the effect of radiation may be to render it more soluble (a "positive-working" resist) or less soluble (a "negative-working" resist). In general, solder resists are commonly based on negative-working photosensitive materials. In either case, after exposure to irradiation, the irradiated coating is "developed" by dissolving away the more soluble portions of the coating with an appropriate solvent.

In practice, thermally curable resist systems have been generally found to give tougher, more resistant coatings than do radiation-cured materials and there have been proposed photoimageable resist compositions which also contain thermally curable components so that after photoimaging and development the patterned resist may be subjected to a final thermal cure to give a good solder-resistant coating.

Since thermally curable compositions generally comprise a thermally curable component, such as an organic resin, together with a catalyst, curing agent or cross-linking agent component potentially reactive with the thermally curable material, it has been the practice to put such compositions up as two-part packs, wherein the potentially reactive components of the composition are separated in different packs, thereby to improve the shelf-like of the product as sold. On mixing the two packs, the resultant composition has a limited shelf or product use life since some reaction of the potentially reactive components will occur, albeit slowly in some cases. This is clearly disadvantageous and also leads to further disadvantages in the case of photoimageable systems in that unwanted residues may appear after the development stage, having been produced during, for example, drying prior to irradiation of the dried coating.

It has now been found, in accordance with the present invention, that thermally curable resist systems (which may also be photoimageable) of improved shelf life and having reduced tendency to residue formation, after mixing, may be obtained by formulating them in two-part pack form and having at least one of the packs containing water, as principal carrier liquid. This has the additional, most important, benefit that the amount of volatile organic solvents employed is markedly reduced, the principal liquid carrier being the environmentally-acceptable liquid, water.

Basically, therefore, the present invention provides a two-part pack system for the preparation of a thermally-curable coating composition, one pack containing a thermally curable material and the other containing a curing system potentially reactive with the thermally curable material, in which at least one, and preferably both, of the packs takes the form of a liquid composition containing water, as principal liquid carrier. The resinous components of the system of the invention will generally be water-insoluble. Accordingly the components of the packs are carried in the water in two principal forms, namely (i) as an emulsion of a solution of the component in an organic solvent (hereinafter simply referred to as "an emulsion"), or (ii) as a dispersion of solid particles of the component in water (hereinafter simply referred to as "dispersions"). As noted above, water is the principal carrier liquid in the packs of the systems of the invention, that is water forms at least 50% of the liquid present and preferably at least 65%, more preferably 87%, thereof.

Two general classes of two-part pack systems in accordance with the invention are contemplated, namely those adapted to be mixed to give a simple thermally curable coating composition and those adapted to give a photoimageable and thermally curable system. Each system will contain certain components of the same general type, namely a photocurable material and a curing system potentially reactive with that thermally curable material. Photoimageable systems will also contain a photosensitive material, typically a negative-working photosensitive material.

As mentioned above, compositions obtained from the two-part packs of the invention have improved shelf life, storage and handling characteristics. We have, in fact, found that it need not be necessary to formulate the composition as a two-part system and that it may be formulated as a one-part system. Accordingly, a modification of the invention provides a thermally curable liquid coating composition containing a thermally curable material and a curing system potentially reactive therewith, in which composition the principal carrier liquid is water and each of the thermally curable material and curing system is present as an emulsion or dispersion in the water. Preferably, the thermally curable material is present as a dispersion.

A wide variety of thermally curable resinous materials are known and may be used in systems in accordances with the invention. A particularly preferred class of thermally curable material comprises the so-called "epoxy resins" or polyepoxy compounds. Epoxy resins are, of course, very well known and are described, for example, in "The Chemistry Of Organic Film Formers, D. H. Solomon, Robert E. Krieger Publishing Co. Inc., 1982, at pages 187–210.

For use as a solder resist material, the epoxy resin is preferably one derived from a phenol or cresol novolak (a novolak epoxy resin). Many curing agents are suitable for use in combination with epoxy resins and examples include polyamides, polyamino resins, dicyandiamide, melamine derivatives and blocked isocyanurate materials. Further, a catalyst may be employed to accelerate reaction between the epoxy resin and the curing agent, for example as imidazole or blocked imidazole compound. In accordance with the invention, of course, the epoxy resin will be present in one pack of the system and the curing agent in the other.

Where the compositions produced from the systems of the invention are to be both photoimageable and thermally curable, one pack will also contain a photosensitive material, typically of the negative-working type. Most conveniently, this photosensitive material will be an ethylenically unsaturated material, such as an ester of an ethylenically unsaturated acid such as acrylic or methacrylic acid, which polymerizes on exposure to irradiation. Particularly preferred ethylenically unsaturated materials are those derived from the reaction of an epoxy resin (especially a novolak epoxy resin) with acrylic or methacrylic acid (hereinafter simply referred to as "epoxy acrylates"). Preferably the epoxy acrylate is further modified (as described in EP-A-04086229) by reaction with a dicarboxylic acid or anhydride thereof to produce a product soluble in (developable by) aqueous alkaline solutions since this form of development is most preferred for environmental reasons.

Other ethylenically unsaturated materials may be present, the esters derived from the reaction of hydroxyethyl (meth) acrylate with sytrene-maleic anhydride copolymers, polyester acrylates and urethane acrylates. Multifunctional acrylate may be added to enhance the photosensitivity of a resist formulation and examples of these are trimethylol propane triacrylate and pentaerythritol tetra-acrylate and their dimens, tris (2-hydroxyethyl) isocyanurate triacrylate and neopentyl glycol diacrylate. Non photoreactive monomers may be present for example to enhance development of the exposed film (eg. styrene-maleic anhydride copolymers of styrene-(meth)acrylic acid derivatives) or to improve the tack-free nature of the dried film (eg. cellulose acetate butyrate).

In order to render the ethylenically unsaturated materials sensitive to ultra-violet light, the composition will also suitably contain a photoinitiator or UV sensitiser, e.g. on organic ketone such as anthraquinone, or the commercially available compounds sold under the trade names Irgacure 651 or Irgacure 907 (Ciba-Geigy).

In addition to the thermally curable material, curing system therefore and, possibly, photoimageable system, coating compositions produced from the systems of the invention may, and most commonly will, contain other components, such as inert particulate fillers, colouring agents, flowaids and defoamers. The fillers, which are generally inorganic fillers, are particularly useful components and examples thereof include silica, alumina, talc, calcium carbonate and barium sulphate.

In order to make up a final coating composition, the two packs of a system in accordance with the invention are mixed together. The compositions contained in the two packs and the relative proportions thereof are suitably such as to give final compositions, for simple thermal curing, having the range of contents noted in Table 1 below.

TABLE 1

| Compound | Preferred range of contents (wt. %) | More preferred content (wt. %) |
| --- | --- | --- |
| Thermally curable resin | 50 to 70 | 55 to 60 |
| Thermal curing agent | 5 to 10 | 6 to 8 |
| Inorganic filler | 5 to 18 | 8 to 15 |
| Liquid carrier (water together with organic solvent, if any) | 20 to 40 | 25 to 35 |

TABLE 1-continued

| Compound | Preferred range of contents (wt. %) | More preferred content (wt. %) |
| --- | --- | --- |
| Minor components (colouring agents, flow aids, etc.) | 2 to 8 | 4 to 6 |

Preferred ranges of contents of the final compositions obtained from two part packs giving photoimageable/thermal curable systems in accordance with the invention are set out in Table 2 below.

TABLE 2

| Compound | Preferred range of contents (wt. %) | More preferred content (wt. %) |
| --- | --- | --- |
| Thermally curable resin | 8 to 22 | 10 to 15 |
| Thermal curing agent | 0.1 to 1.2 | 0.3 to 1.0 |
| Photosensitive resin | 35 to 50 | 38 to 63 |
| Photoiniator | 3 to 12 | 5 to 9 |
| liquid carrier (water together with organic solvent if any) | 30 to 50 | 35 to 45 |
| Minor components (flow aids, colouring agents, etc.) | 0.5 to 4.0 | 2.0 to 3.0 |

As noted above, the liquid compositions employed in the present invention take the form of emulsions or dispersions. In the case of an emulsion the material to be emulsified is firstly dissolved in an appropriate organic solvent, and the solution is then emulsified with the appropriate amount of water, typically using an emulsifying aid in suitable apparatus such as a Silverson high speed stirrer. Thus, the material to be emulsified is dissolved to give a relatively unconcentrated solution (e.g. containing 50 to 80% by weight of solids) in a solvent such as a glycol ether ester (e.g. isopropyl cellosolve acetate). Suitable emulsifying agents include polyethoxy-polypropoxy sorbitans hydrophobically modified ethylene oxide urethanes (e.g. the produce RM 8 sold by Rohm & Haas or the products Rheolate 205 or Rheloate 208 sold by Rheox Ltd), and polyvinyl alcohol/polyvinyl pyrrolidone copolymers (such as the product Collacryl VL sold by BASF). The use of emulsions is particularly suitable, of course, when the material to be put up in liquid form is itself a liquid. In the case of solid materials, a dispersion system may be employed and, in this case, the solid components are divided (ground) to a suitable particle size (e.g. 0.5 to 4 microns), and then dispersed, using suitable apparatus in water, again suitably using an appropriate dispersion aid such as are of those discussed above.

In use, the packs of a system in accordance with the invention are mixed in the appropriate ratio and the resultant liquid component is then applied to the desired substrate, generally in patterned from (through a patterned screen) for the simple thermally curable compositions, or as an overall layer for photoimageable/thermally curable systems. In this latter case, any suitable coating system may be used such as curtain coating, roller coating, dip coating etc. The thickness of the coating will, of course, depend upon the intended end use and nature of the resists; (thicknesses of 20 to 80 μm (measured as dry filler thicknesses) generally prove suitable.

After application of the liquid coating composition to the substrate, it is, in the case of the thermally curable systems, simply cured by heating e.g. at a temperature of 120° to 150° C. for a period of 10 to 60. In the case of the photoimageable/thermally curable systems, the applied liquid coating is generally first dried, to give a substantially tack-free film, imagewise exposed to radiation, developed and then finally thermally cured, for example under the conditions noted above.

In order that the invention may be well understood the following examples are given by way of illustration only.

EXAMPLE 1

| | |
|---|---|
| Epoxy resin (Den 438, Dow Chemicals) | 69 parts by weight |
| Talc | 25 parts by weight |
| Phthalocyanin Green | 2 parts by weight |
| Silicone Antifoam | 1 parts by weight |
| Butyl Cellosolve | 3 parts by weight |

The above formulation was three roll milled together to produce a smooth green ink, which was then emulsified in water using Atlas G1350 emulsification aid in the following formulation:

| | |
|---|---|
| Ink (as above) | 67 parts by weight |
| Surfactant (G1350) | 8 parts by weight |
| Distilled water | 25 parts by weight |

This was mixed using a Silverson high speed stirrer to yield a stable green coloured oil in water emulsion.

The thermal curing agent dispersion was prepared by mixing the following:

| | |
|---|---|
| Expoxy resin (MS1914, CIBA GEIGY) | 34 parts by weight |
| Diamino diphenyl methane | 26 parts by weight |
| Propylene glycol ethyl ether | 32 parts by weight |
| Propylene glycol methyl ether acetate | 8 parts by weight |

This mixture was emulsified by the addition of a suitable surfactant, followed by distilled water as follows:

| | |
|---|---|
| Thermal curing agent | 73 parts by weight |
| Emulsificant (RM8, ROHM and HAAS) | 7 parts by weight |
| Distilled water | 20 parts by weight |

The ink formulation and cross-linking agent were then mixed in the ratio 2:1; ink:cross-linking agent, and screen printed through a 29 threads per centimeter polyester mesh screen having a suitable solder resist pattern onto an IPC solder resist test pattern board. The board was then baked at 120°–140° C. for one hour to produce a resist which displayed the required thermal, physical and chemical resistance expected of it.

The mixed resist was then stored at 40° C. and tested for usability every 24 hours, the resist remained viable under these conditions for days. The unemulsified mixed resist remaining viable for only 14–16 hours at room temperature.

EXAMPLE 2

A carboxylated epoxy cresol novolak acrylate resin was produced by reacting one equivalent weight of acrylic acid pro rata with Quatrex 3710, an epoxy cresol novolak resin produced by Dow Chemicals, dissolved in ethyl 3-ethoxypropionate. The resultant acrylated resin was then rendered soluble in dilute alkaline solutions by adducting maleic anhydride and tetrahydrophothalic anhydride to yield a resin with an acid value of 70 mg/g KOH.

This resin was then used to produce an ink with the following formulation:

| | |
|---|---|
| Carboxylated epoxy cresol novolak acrylate | 78.9 parts by wt. |
| Photoinitiator (Irgacure 907, Ciba Geigy) | 9.3 parts by wt. |
| Photoinitiator (Quantacure ITX, Ward Blenkinsop | 1.6 parts by wt. |
| Flow aid (Modaflow 2, Monsanto Inc.) | 2.1 parts by wt. |
| Pigment dispersion (Anthalocyanin green) | 2.8 parts by wt. |
| Ethyl 3-ethoxypropionate | 2.8 parts by wt. |
| Cure catalyst | 2.5 parts by wt. |

The cure catalyst was formulated as follows:

| | |
|---|---|
| 2-ethyl-4-methyl imidazole | 31.5 parts by weight |
| N methyl pyrrolidone | 31.0 parts by weight |
| Dicyandiamide | 8.5 parts by weight |
| Dipropylene glycol methyl ether | 9.0 parts by weight |
| Cellulose acetate butyrate resin | 5.0 parts by weight |
| Silica | 15.0 parts by weight |

The ink formulation was then dispersed by high speed stirring into the following system:

| | |
|---|---|
| Ink (as above) | 72 parts by weight |
| Surfactant (Rheolate 205, Rheox Inc) | 7 parts by weight |
| Distilled water | 21 parts by weight |

This yielded a green, stable oil-in-water emulsion of screen printable viscosity.

A sample of cross-linking agent was also produced using the following formulation:

| | |
|---|---|
| Epoxy novolak resin (Quatrex 2410, Dow Chemical) | 38.9 parts by weight |
| Tris(2-hydroxyethyl) Isocyanurate triacrylate | 10.8 parts by weight |
| Talc | 29.7 parts by weight |
| Ethyl 3-ethoxypropionate | 20.6 parts by weight |

This formulation was mixed with an emulsification aid and high speed dispersed using a Silverson high speed stirrer in distilled water to yield a creamy white oil in water emulsion.

| | |
|---|---|
| Cross-linking agent (as above) | 75 parts by weight |
| Surfactant | 6 parts by weight |
| Distilled water | 19 parts by weight |

The ink formulation and cross-linking agent were mixed in a 2:1 ratio with a spatula and then printed onto a cleaned IPC solder resist test panel. The film produced was then dried at 90° C. for ½ hour to give a smooth, tack-free film. The resitst was then imaged through suitable artwork and the image developed in 0.6% w/w sodium carbonate solution. The resist film was then given a final post bake at 150° C. for 1 hour to yield a coating which showed excellent solder, scratch and solvet resistance properties. The mixed resist also showed excellent mixed pot-life.

EXAMPLE 3

A solid carboxylated epoxy cresol novolak acrylate was prepared by reacting an equivalent of acrylic acid with an equivalent of epoxy cresol novolak resin (Quatex 3710, Dow Chemicals) dissolved in toluene. Once acrylated, the resin was carboxylated using maleic and tetrahydrophthalic anhydrides (in a ration of 1:1) and the solvent was vacuum stripped off to yield a solid resin with a melting point of 95°–100° C. and an acid value of 75 mg/g KOH.

This resin was then mixed with the following materials in a twin screw extruder:

| | |
|---|---|
| Solid carboxylated epoxy cresol novolak acrylate | 82.8 parts by wt. |
| Photoinitiator I (Irgacure 907, Ciba Geigy) | 7.3 parts by wt. |
| Photoinitiator II (Quantacure ITX, Ward Blenkinsop) | 1.6 parts by wt. |
| Pigment dispersion (Phthalocyanin green) | 1.0 parts by wt. |
| Silica | 6.5 parts by wt. |
| Cure catalyst | 0.8 parts by wt. |

The cure catalyst was formulated as follows:

| | |
|---|---|
| 2-ethyl-4-methyl imidazole | 80 parts by wt. |
| Dicyandiamide | 20 parts by wt. |

The solid material formed was then ground using a blade grinder to give a coarse powder of around 25 micron powder size. The powder was then added to a solution of surfactant in distilled water (as indicated below).

| | |
|---|---|
| Powdered resist (as above) | 53 parts by weight |
| Surfactant (Atlas G1350, ICI Ltd.) | 8 parts by weight |
| Distilled water | 39 parts by weight |

The slurry was then ball-milled for 12 hours to yield a suspension with solid particle sizes substantially below 10 microns.

A solid cross-linking agent was then prepared by grinding a solid bis-phenol a di-epoxy resin (Epikote 1001, Esso Chemicals) down to a particle size of around 20 microns, suspending this powder in the formulation shown below and ball milling the slurry to give a stable suspension with particle size substantially below 10 microns.

| | |
|---|---|
| Epoxy resin | 52 parts by weight |
| Surfactant (RM8, ROHM & HAAS) | 8 parts by weight |
| Distilled water | 40 parts by weight |

The ink and cross-linking formulations were mixed 4:1 and the resulting green ink was screen printed onto an IPC solder resist test panel. The film was dried in a convention oven at 80° C. for ½ hour to yield a hard tack-free surface. The resist was then imaged through suitable art-work, developed using 0.6% w/w sodium carbonate solution at 40° C. and finally, thermally cured at 150° C. for 1½ hours. The resist formed gave a good glossy film with excellent resolution which displayed good resistance to soldering, solvent rub and pencil hardness tests.

We claim:

1. A two pack system for the preparation of a thermally-curable coating composition comprising:

a first pack including a thermally curable material;

a second pack including a curing system reactive with the thermally curable material;

at least one of the packs comprising a liquid composition, said liquid composition having water as a principal ingredient;

said first and second packs each comprising a liquid composition with water as a principal ingredient and is selected from the group of compositions consisting of an aqueous dispersion of solid particles and an aqueous emulsion of an organic solvent solution;

wherein at least one pack also includes a photosensitive material, thereby rendering the coating compositions photoimageable.

2. A two pack system as recited in claim 1, wherein both packs comprise a liquid composition with water as a principal ingredient.

3. A two pack system as recited in claim 2, wherein said liquid composition is selected from the group of compositions consisting of an aqueous dispersion of solid particles and an aqueous emulsion of an organic solvent solution.

4. A two pack system as recited in claim 1, wherein said liquid composition is selected from the group of compositions consisting of an aqueous dispersion of solid particles and an aqueous emulsion of an organic solvent solution.

5. A method of forming a patterned resist upon a substrate or a printed circuit board, comprising the steps of;

providing a two pack system comprising a first pack including a photosensitive and thermally curable material and a second pack including a curing system reactive with the photosensitive and thermally curable material, with at least one of the packs comprising a liquid composition having water as a principal ingredient;

causing the contents of the two packs to mix together;

applying the mixed contents to a substrate or printed circuit board, thereby coating the substrate or circuit board;

drying the coating;

photoimaging the coating;

thermally curing the photoimaged coating; and removing uncured portions of the coating.

6. A method of forming a patterned solder resist upon a substrate or a printed circuit board, comprising the steps of:

providing a two pack system comprising a first pack including a photosensitive and thermally curable material and a second pack including a curing system reactive with the photosensitive and thermally curable material, with at least one of the packs comprising a liquid composition having water as a principal ingredient;

causing the contents of the two packs to mix together to form a solder resist coating material;

applying the solder resist coating material to a substrate or printed circuit board, thereby coating the substrate or circuit board;

drying the coating;

photoimaging the coating;

thermally curing the photoimaged coating; and removing uncured portions of the coating.

* * * * *